United States Patent [19]

Kidoguchi et al.

[11] Patent Number: 5,383,214
[45] Date of Patent: Jan. 17, 1995

[54] SEMICONDUCTOR LASER AND A METHOD FOR PRODUCING THE SAME

[75] Inventors: Isao Kidoguchi, Mino; Satoshi Kamiyama, Sanda; Kiyoshi Ohnaka, Moriguchi, all of Japan

[73] Assignee: Matsushita Electric Industrial Co., Ltd., Osaka, Japan

[21] Appl. No.: 92,358

[22] Filed: Jul. 15, 1993

[30] Foreign Application Priority Data

Jul. 16, 1992 [JP] Japan .................................. 4-189074
Oct. 23, 1992 [JP] Japan .................................. 4-285740

[51] Int. Cl.$^6$ ............................................... H01S 3/19
[52] U.S. Cl. ..................................... 372/46; 372/45; 437/129
[58] Field of Search ..................... 372/45, 46; 437/129

[56] References Cited

U.S. PATENT DOCUMENTS 4,959,839  9/1990  Yamamoto ............................. 372/46

FOREIGN PATENT DOCUMENTS 0260485  10/1990  Japan ..................................... 372/46

OTHER PUBLICATIONS

H. Fujii et al. "High-Powered Operation of a Transverse-mode Stabilised AlGaInP Visible Light ($\lambda_f$ =683 nm) Semiconductor Laser", *Electronics Letters*, vol. 23, No. 18, Aug. 27, 1987, pp. 938–939.

I. Kidoguchi et al., "Extremely high quantum efficiency (86%) operation of AlGaInP visible laser diode with lateral leaky waveguide structure", *Appl. Phys. Lett.* 62(21), May 24, 1993, pp. 2602–2604.

I. Kidoguchi et al., "AlGaInP Visible Laser Diode with Extremely High Quantum Efficiency Having Lateral Leaky Waveguide Structure", *International Electron Devices meeting*, San Francisco, Calif., Dec. 13–16, 1992, pp. 34.5.1–34.5.4.

*Primary Examiner*—Georgia Y. Epps
*Attorney, Agent, or Firm*—Ratner & Prestia

[57] ABSTRACT

A semiconductor laser including a semiconductor substrate and a multilayer structure formed upon the semiconductor substrate, the multilayer structure including an active layer, a pair of cladding layers between which the active layer is interposed, and a current confinement layer for injecting a current into a stripe-shaped predetermined region of the active layer. The current confinement layer comprises a first current blocking layer formed in regions thereof excluding a region corresponding to the predetermined region of the active layer. The first current blocking layer has a refractive index higher than a refractive index of the pair of cladding layers and an energy band gap larger than an energy band gap of the active layer.

13 Claims, 8 Drawing Sheets

SEMICONDUCTOR LASER AND A METHOD FOR PRODUCING THE SAME

BACKGROUND OF THE INVENTION

1. Field of the Invention

The present invention relates to a high-power semiconductor laser with a high generation efficiency of light and a high fundamental-lateral-mode stability and a method for producing the same.

2. Description of the Related

Semiconductor lasers which oscillate laser beams in the visible region of the spectrum (visible laser diodes) have applications to such devices as laser beam printers and light sources for optical information processing devices such as optical disks, and therefore tend to have increased importance in these days. Materials of an $(Al_xGa_{1-x})_{0.51}In_{0.49}P$ type, in particular, are attracting much attention because they can easily be lattice-matched to GaAs, which is an excellent material for substrates, and can oscillate laser beams having a wavelength in the range of 0.56 μm to 0.68 μm by varying the mole fraction x.

Hereinafter, a conventional semiconductor laser of a lateral-mode-control type having a doublehetero structure, which oscillates light of wavelengths pertaining to red regions, will be described.

As is shown in FIG. 10, this semiconductor laser includes an n-GaAs substrate 1, an n-GaAs buffer layer 2, an n-$(Al_{0.7}Ga_{0.3})_{0.51}In_{0.49}P$ cladding layer 3, a $Ga_{0.51}In_{0.49}P$ active layer 4, a p-$(Al_{0.7}Ga_{0.3})_{0.51}In_{0.49}P$ cladding layer 5, a p-$Ga_{0.51}In_{0.49}P$ layer 6, an n-GaAs current blocking layer 13, and a p-GaAs capping layer 9 formed in this order. A p-side electrode 10 and an n-side electrode 11 are formed, respectively, upon the p-GaAs capping layer 9 and upon the bottom side of the substrate 1.

Fabrication of the semiconductor laser employs a crystal growing method such as a metal organic vapor phase epitaxy (MOVPE) method. By the use of such a crystal growing method, the n-GaAs buffer layer 2, the n-$(Al_{0.7}Ga_{0.3})_{0.51}In_{0.49}P$ cladding layer 3, the $Ga_{0.51}In_{0.49}P$ active layer 4, the p-$(Al_{0.7}Ga_{0.3})_{0.51}In_{0.49}P$ cladding layer 5, and the p-$Ga_{0.51}In_{0.49}P$ layer 6 are grown upon the n-GaAs substrate 1 in the respective order. Next, by photolithography and etching, the p-$(Al_{0.7}Ga_{0.3})_{0.51}In_{0.49}P$ cladding layer 5 and the p-$Ga_{0.51}In_{0.49}P$ layer 6 are etched so as to form a stripe-shaped ridge. Then, by an MOVPE method or the like, the n-GaAs current blocking layer 13 is selectively grown on the side slopes of the stripe-shaped ridge, and the p-GaAs capping layer 9 is grown on the n-GaAs current blocking layer 13. The p-side electrode 10 and the n-side electrode 11 are formed, respectively, upon the p-GaAs capping layer 9 and upon the bottom side of the substrate 1.

According to a semiconductor laser of this structure, a current can be confined by the n-GaAs current blocking layer 13. Moreover, by etching the p-$(Al_{0.7}Ga_{0.3})_{0.51}In_{0.49}P$ cladding layer 5 to form stripe-shaped ridge having a trapezoidal cross section, effective refractive indices inside and outside stripe-shaped ridge can be made to have a difference which meets the requirements of a single lateral mode by optimizing the height and width of the trapezoid. As a result, light can be effectively contained in a predetermined region of the $Ga_{0.51}In_{0.49}P$ active layer 4, the predetermined region being under the stripe-shaped ridge of the p-$(Al_{0.7}Ga_{0.3})_{0.51}In_{0.49}P$ cladding layer 5. A typical width of each stripe of the stripe-shaped ridge is about 5 μm.

However, in the above-mentioned conventional semiconductor laser shown in FIG. 10, the current blocking layer 13 is made of GaAs, which has a smaller energy band gap than that of the $Ga_{0.51}In_{0.49}P$ active layer 4. As a result, the current blocking layer 13 serves to absorb light, that is, a large amount of light is lost so that a propagation loss $\alpha_i$ which occurs when light is propagated through a cavity of the semiconductor laser is as large as about 15 cm$^{-1}$. This causes the external differential quantum efficiency to be as small as about 60%. Moreover, the kink level is as small as about 12 mW. Kinks are known to occur when the lateral mode shifts. In the semiconductor laser of the above structure, since the fundamental mode and higher modes have only small differences in gain, an increase of an injected current can easily cause one mode to shift to another; therefore kinks are likely to occur.

As has been described, the conventional structure cannot realize a semiconductor laser with a high output of light, due to the small external differential quantum efficiency and low stability of the fundamental lateral mode.

SUMMARY OF THE INVENTION

A semiconductor laser according to the present invention comprises:

a semiconductor substrate; and a multilayer structure formed upon the semiconductor substrate, the multilayer structure including an active layer, a pair of cladding layers between which the active layer is interposed, and a current confinement layer for injecting a current into a stripe-shaped predetermined region of the active layer, wherein the current confinement layer comprises a first current blocking layer formed in regions thereof excluding a region corresponding to the predetermined region of the active layer, the first current blocking layer having a refractive index higher than a refractive index of the pair of cladding layers and an energy band gap larger than an energy band gap of the active layer.

In one embodiment of the invention, one of the pair of cladding layers that is disposed above the active layer has a stripe-shaped ridge stretching along a direction of a cavity of the semiconductor laser; end the first current blocking layer, formed upon the one of the pair of cladding layers having the stripe-shaped ridge covers a region of the one of the pair of cladding layers excluding the stripe-shaped ridge thereof.

In another embodiment of the invention, the current confinement layer further comprises a second current blocking layer formed upon the first current blocking layer; and the second current blocking layer is a semiconductor layer having a larger energy band gap than the energy band gap of the active layer.

In still another embodiment of the invention, a cross section of the stripe-shaped ridge constituting a plane perpendicular to the direction of the cavity is trapezoidal.

In still another embodiment of the invention, a cross section of the stripe-shaped ridge constituting a plane perpendicular to the direction of the cavity is rectangular.

In still another embodiment of the invention, the semiconductor substrate is made of GaAs; the active layer is made of GaInP; and the first and second current blocking layers end the pair of cladding layers are made of AlGaInP.

In still another embodiment of the invention, the active layer has a multiple quantum layer structure.

In still another embodiment of the invention, one of the pair of cladding layers has a first layer and a second layer, between which the first current blocking layer is interposed.

In still another embodiment of the invention, the semiconductor substrate is made of GaAs; the pair of cladding layers are made of GaInP; and the first current blocking layer is made of GaAs.

In still another embodiment of the invention, the active layer has a multiple quantum well structure.

According to another aspect of the invention, a method for producing a semiconductor laser is provided. The method includes the step of forming a multi-layer structure upon a semiconductor substrate, the step comprising the steps of:

forming a first cladding layer;

forming an active layer upon the first cladding layer;

forming a film to become a second cladding layer upon the active layer;

selectively etching a portion of the film so as to form a stripe-shaped ridge stretching along the direction of a cavity, thereby forming the second cladding layer;

forming a first semiconductor layer upon a portion of the second cladding layer excluding the stripe-shaped ridge, the first semiconductor layer having a refractive index higher than a refractive index of the second cladding layer and an energy band gap larger than the energy band gap of the active layer and forming a second semiconductor layer on the first semiconductor layer, the second semiconductor layer having a different refractive index from the refractive index of the first semiconductor layer and having an energy band gap larger than the energy band gap of the active layer.

The current confinement layer of a semiconductor laser according to the present invention includes a first current blocking layer formed in regions excluding a region corresponding to the stripe-shaped predetermined region of the active layer. The first current blocking layer has a refractive index higher than those of the pair of cladding layers and an energy band gap larger than that of the active layer.

The first current blocking layer serves to prevent a current from flowing into the active layer, so that the current is injected into only the predetermined region of the active layer, namely, a region above which the first current blocking layer does not exist. As a result, a laser beam is generated in only the stripe-shaped predetermined region of the active layer. A portion of this laser beam leaks upwards and downwards from the active layer, finally reaching the cladding layers and the first current blocking layer. More specifically, the portion of the laser beam leaks laterally from the stripe-shaped predetermined region, since the first current blocking layer has a refractive index higher than that of the active layer. This is explained by a fact that a light beam generally gathers in a region having a high refractive index.

A laser beam oscillating in higher lateral modes, as compared with that oscillating in the fundamental lateral mode, is distributed relatively widely in the lateral direction. As a result, in a semiconductor laser according to the present invention, a laser beam oscillating in higher lateral modes leaks laterally more than a laser beam oscillating in the fundamental lateral mode does. In other words, the laser beam oscillating in higher lateral modes diffuses so as to lose its influence on the laser oscillation. Stated otherwise, incorporation of the first current blocking layer ensures that the laser beam oscillating in higher lateral modes has a higher threshold gain than that of the laser beam oscillating in the fundamental lateral mode, whereby only the laser beam oscillating in the fundamental lateral mode can be selectively obtained.

Moreover, since the first current blocking layer has an energy gap larger than that of the active layer, a laser beam generated from the active layer is not absorbed by the first current blocking layer. Therefore, propagation loss of the laser beam is reduced as compared with a conventional semiconductor laser.

Thus, the invention described herein makes possible an advantage of providing a semiconductor laser capable of oscillating a laser beam in the fundamental lateral mode with a small propagation loss.

This and other advantages of the present invention will become apparent to those skilled in art upon reading and understanding the following detailed description with reference to the accompanying figures.

DESCRIPTION OF THE PREFERRED EMBODIMENTS

Hereinafter, examples of the present invention will be described with reference to the accompanying figures.

Examples 1

Figure 1:
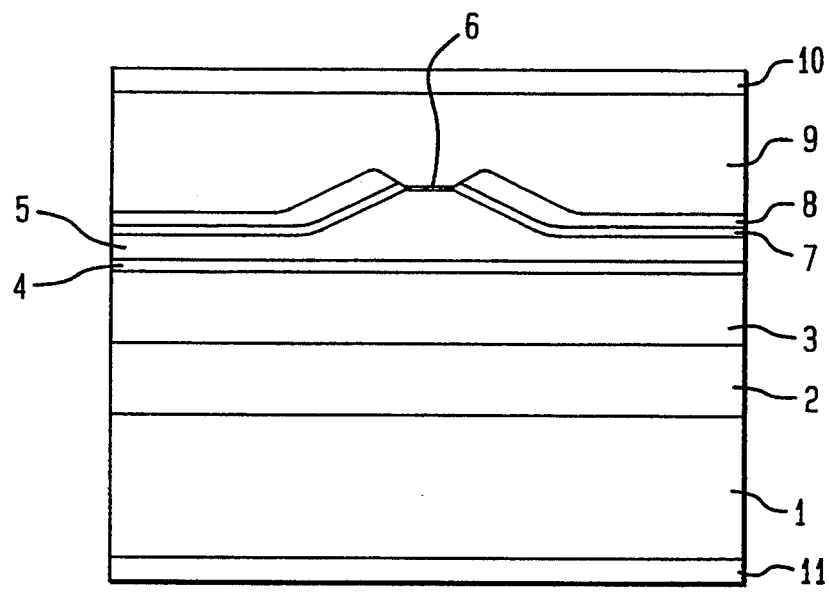
FIG. 1 is a cross-sectional view showing a fundamental-lateral-mode-control type semiconductor laser for generating light of a red band according to a first example of the present invention.

FIG. 1 is a cross-sectional view showing an example of a lateral-mode-control type semiconductor laser for generating light of a red band according to the present invention.

The semiconductor laser has, as is shown in FIG. 1, a doublehetero structure in which a $Ga_{0.51}In_{0.49}P$ active layer 4 (thickness: 60 nm) is interposed between an n-$(Al_{0.7}Ga_{0.3})_{0.51}In_{0.49}P$ cladding layer 3 and a p-$(Al_{0.7}Ga_{0.3})_{0.51}In_{0.49}P$ cladding layer 5. These layers 3 to 5 are grown on an n-GaAs buffer layer 2, which in turn is grown on an n-GaAs substrate 1. Upon the p-$(Al_{0.7}Ga_{0.3})_{0.51}In_{0.49}P$ cladding layer 5, a p-$Ga_{0.51}In_{0.49}P$ layer 6 (thickness: 100 nm)is formed. A portion of the p-$(Al_{0.7}Ga_{0.3})_{0.51}In_{0.49}P$ cladding layer 5 and the p-$Ga_{0.51}In_{0.49}P$ layer 6 are formed into a stripe-shaped ridge having a trapezoidal cross section. The p-$(Al_{0.7}Ga_{0.3})_{0.51}In_{0.49}P$ cladding layer 5 has a thickness of 1.3 μm at the stripe-shaped ridge, and a thickness of 0.25 μm at portions excluding the stripe-shaped ridge. Upon the portions of the p-$(Al_{0.7}Ga_{0.3})_{0.51}In_{0.49}P$ cladding layer 5 excluding the stripe-shaped ridge, an n-$(Al_{0.2}Ga_{0.8})_{0.51}In_{0.49}P$ first current blocking layer 7 (thickness: 70 nm) and an n-$(Al_{0.7}Ga_{0.3})_{0.51}In_{0.49}P$ second current blocking layer 8 (thickness: 0.7 μm) are grown. Furthermore, upon the p-$Ga_{0.51}In_{0.49}P$ layer 6 and the n-$(Al_{0.7}Ga_{0.3})_{0.51}In_{0.49}P$ second current blocking layer 8, a p-GaAs capping layer 9 is grown.

The above-mentioned stripe-shaped ridge has such a width that the fundamental lateral mode and higher modes have a large difference in gain from each other. The width is preferably about 7 μm. If the width is considerably smaller than 7 μm, e.g., if the width is about 2 μm, an excessive amount of light leaks outside the stripes, thus increasing such light as will not contribute to laser oscillation. This results in a higher threshold current and a larger loss in light generation, thereby lowering the external differential quantum efficiency. On the other hand, if the width is considerably larger than 7 μm, such problems as the following occur: 1) the difference in gain between the fundamental lateral mode end higher modes becomes small; and 2) carriers tend to be injected into the $Ga_{0.51}In_{0.49}P$ active layer 4 with some inequality in the horizontal direction, thus lowering the kink level. In either case, practicality of the semiconductor laser is fatally undermined.

Although the stripe-shaped ridge has a trapezoidal cross section in the present example, it may alternatively have a rectangular cross section. In this case, it is preferred that neither n-$(Al_{0.2}Ga_{0.8})_{0.51}In_{0.49}P$ first current blocking layer 7 nor the n-$(Al_{0.7}Ga_{0.3})_{0.51}In_{0.49}P$ second current blocking layer 8 be grown on vertical sides of the rectangle.

Figure 2:
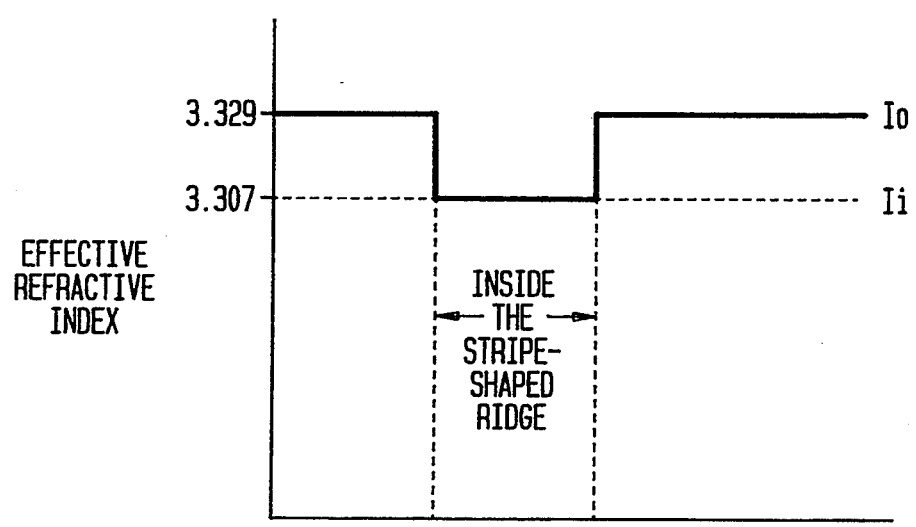
FIG. 2 is a graph showing effective refractive indices in a direction parallel to each layer of a semiconductor laser according to the first example of the present invention.

FIG. 2 illustrates effective refractive indices in the horizontal direction of the semiconductor laser shown in FIG. 1. An effective refractive index of such a semiconductor laser is determined by the layers that constitute the semiconductor laser. As is seen from FIG. 2, the semiconductor laser has an effective refractive index of 3.307 inside stripe-shaped ridge, and an effective refractive index Io of 3.329 outside the stripe-shaped ridge, the effective refractive index Io being larger than the effective refractive index Ii by 0.022. This difference of 0.022 between the effective refractive indices Io and Ii, which is due the n-$(Al_{0.2}Ga_{0.8})_{0.51}In_{0.49}P$ first current blocking layer 7 (thickness: 70 nm) and the n-$(Al_{0.7}Ga_{0.3})_{0.51}In_{0.49}P$ second current blocking layer 8 (thickness: 0.7 μm), brings about a large difference in gain between the fundamental lateral mode and higher modes. As a result, kinks are not likely to occur even when a large amount of current is injected, whereby it is made possible to obtain a high output of light without kinks.

Figure 11:
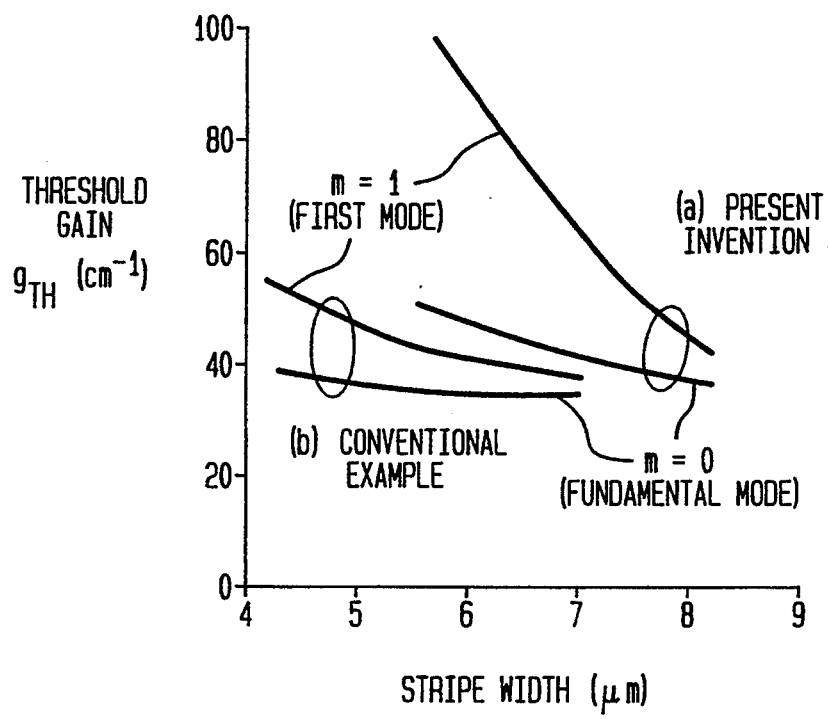
FIG. 11 is a graph illustrating differences in threshold gain between the fundamental mode (m=0) and the first mode (m=1), with respect to each of a semiconductor laser according to the first example of the present invention and a conventional example of a semiconductor laser.

FIG. 11 illustrates the large difference in gain between the fundamental lateral mode and higher modes, which is brought about by the difference of 0.022 between the effective refractive indices Io and Ii. In FIG. 11, the axis of ordinates represents the width of a stripe, while the axis of abscissas represents the threshold gain $g_{th}$. Two curves, namely a curve illustrating the fundamental mode (M=0) and that illustrating the first mode (m=1), are offered for each of a semiconductor laser of the present invention ((a)) and a semiconductor laser of a conventional example ((b)). As is seen from FIG. 11, the laser of the conventional example ((b)) has only a small difference in threshold gain between the fundamental mode and the first mode; therefore, higher modes ouch as the first mode are likely to occur. On the contrary, the laser of the present invention ((a)) has a large difference in threshold gain between the fundamental mode and the first mode; therefore, higher modes such as the first mode are not likely to occur.

Figure 14:
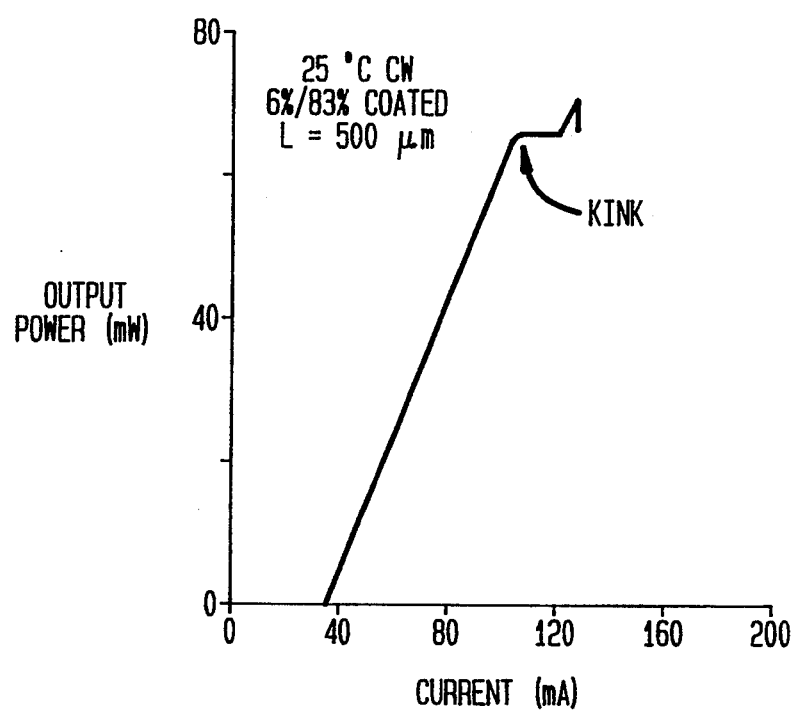
FIG. 14 is a graph illustrating the relationship between a driving current and output of light of a semiconductor laser according to the first example of the present invention.

FIG. 14 illustrates the relationship between a driving current (CURRENT) and output of light (OUTPUT POWER) of a semiconductor laser according to the present invention, in which an end from which a laser beam is emitted is coated with a film having a reflection index of 6% and the other end is coated with a film having a reflection index of 83%; the cavity length (L) is 500 μm. As is seen from FIG. 14, the output of light linearly increases until reaching about 65 mW as the driving current increases; however, the degree ratio of increase of the output of light temporarily lowers after the output of light exceeds about 65 mW. Such a portion of the graph (where the amount of increase of the output of light lowers temporarily) is commonly referred to as a kink. A kink does not occur when the output of light is below a certain level (commonly referred to as 'kink level'), because a laser beam of only the fundamental mode (M=0) is oscillated; a kink occurs because, when the output of light exceeds the kink level, laser beams of higher modes (m≧1) occur in addition to a laser beam of the fundamental mode, so that a mixture of both modes inevitably results. Therefore, a semiconductor laser with a high kink level can attain higher output of a laser beam of the fundamental mode with a higher stability. The kink level rises as the difference in threshold gain between the laser beam of the fundamental mode (M=0) and the laser beams of higher modes (m≧1) increases.

Figure 15:
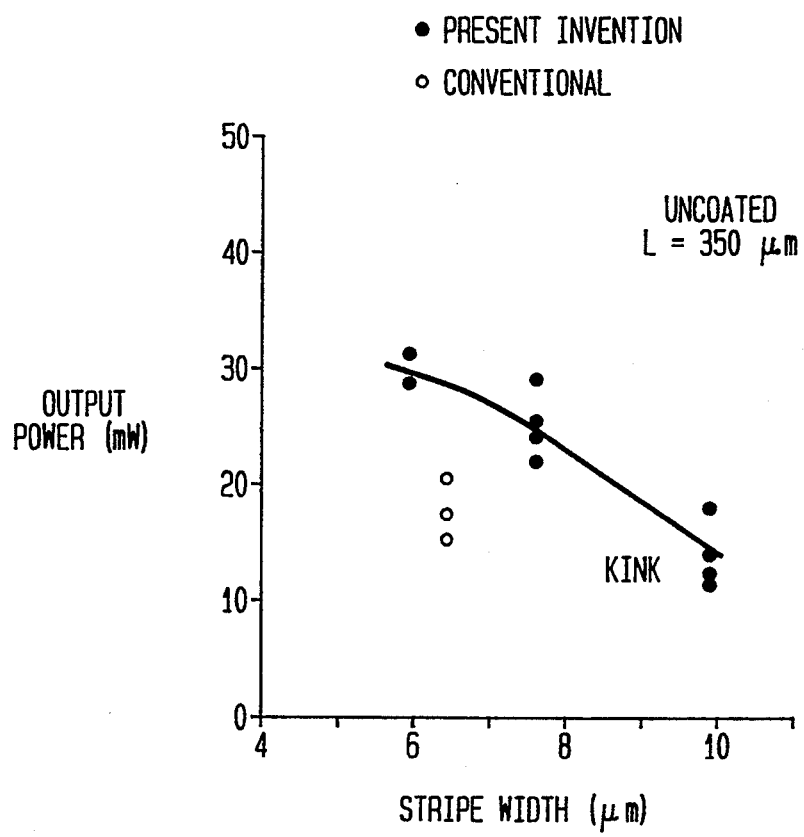
FIG. 15 is a graph illustrating the relationship between a width of a stripe-shaped ridge and a kink level of a semiconductor laser according to the first example of the present invention.

FIG. 15 is a graph showing the relationship between the width of the stripe-shaped ridge in the $Ga_{0.51}In_{0.49}P$ active layer 4 and the kink level, in regard to the semiconductor laser of the structure shown in FIG. 1 and a semiconductor laser of a conventional example. The semiconductor lasers which were used in the measurement both had a cavity length (L) of 350 μm. Neither end of each semiconductor laser was coated with a reflecting film or the like.

As is seen from FIG. 15, the semiconductor laser of the present example has a higher kink level than a conventional semiconductor laser, which fact indicates that the semiconductor laser according to the present invention has a larger difference in threshold gain between the fundamental mode (M=0) and higher modes (m≧1) than a conventional semiconductor laser does.

Moreover, the n-$(Al_{0.2}Ga_{0.8})_{0.51}In_{0.49}P$ first current blocking layer 7 and the n-$(Al_{0.7}Ga_{0.3})_{0.51}In_{0.49}P$ second current blocking layer 8 serve also as layers for blocking a current injected from the p-side electrode 10 into the n-side electrode 11, and for confining the current into stripe-shaped ridge of the p-$(Al_{0.7}Ga_{0.3})_{0.51}In_{0.49}P$ cladding layer 5, whereby the current is injected into a predetermined region of the $Ga_{0.51}In_{0.49}P$ active layer 4.

Furthermore, referring to the two semiconductor layers of the n-$(Al_{0.2}Ga_{0.8})_{0.51}In_{0.49}P$ first current blocking layer 7 and the n-$(Al_{0.7}Ga_{0.3})_{0.51}In_{0.4}P$ second current blocking layer 8 provided so as to achieve a difference between respective refractive indices inside and outside the stripe-shaped ridge having a trapezoidal cross section, the following holds: The first semiconductor layer, namely the n-$(Al_{0.2}Ga_{0.8})_{0.51}In_{0.4}P$ first current blocking layer 7, has a refractive index larger than that of the p-$(Al_{0.7}Ga_{0.3})_{0.51}In_{0.49}P$ cladding layer 5. The second semiconductor layer, namely the n-$(Al_{0.7}Ga_{0.3})_{0.51}In_{0.49}P$ second current blocking layer 8 has substantially the same refractive index as that of the p-$(Al_{0.7}Ga_{0.3})_{0.51}In_{0.49}P$ cladding layer 5.

The difference in respective effective refractive indices inside and outside the stripe-shaped ridge can be adjusted simply by varying the thickness of the n-$(Al_{0.2}Ga_{0.8})_{0.51}In_{0.49}P$ first current blocking layer 7. More specifically, the difference increases as the thickness of the n-$(Al_{0.2}Ga_{0.8})_{0.51}In_{0.49}P$ first current blocking layer 7 increases. The difference can be varied in this manner within the range of 0.01 to 0.05.

Varying the aluminum content of the first semiconductor layer is another way of controlling the difference in respective effective refractive indices inside and outside the stripe-shaped ridge; in the case of the n-$(Al_{0.2}Ga_{0.8})_{0.51}In_{0.49}P$ first current blocking layer 7 of the present example, the aluminum content is 0.2. More specifically, the difference increases as the aluminum content of the first semiconductor layer decreases.

Alternatively, if only one kind of semiconductor layer is to be used, in order to achieve a desired difference in respective effective refractive indices inside and outside the stripe-shaped ridge, it is necessary to grow a layer made of a material such as n-$(Al_{0.55}Ga_{0.45})_{0.51}In_{0.49}P$, which has a refractive index higher than but very close to that of the P-$(Al_{0.7}Ga_{0.3})_{0.51}In_{0.49}P$ cladding layer 5 with little variation in composition. The layer should also be formed to a certain thickness e.g., 1 μm or more. However, in this case, there is an influence by a refractive index at a portion distant from the $Ga_{0.51}In_{0.49}P$ active layer 4. Moreover, if the composition of the layer such as n-$(Al_{0.55}Ga_{0.45})_{0.51}In_{0.49}P$, which determines the refractive index thereof, shifts from predetermined mole fractions, the difference in respective effective refractive indices inside and outside the stripe-shaped ridge also shifts. If the layer is formed to a thickness smaller than that given above, light generated from the $Ga_{0.51}In_{0.49}P$ active layer 4 is absorbed by the p-GaAs capping layer 9, causing a loss in optical energy. In summary, such a semiconductor laser cannot be produced with a high stability or a high repeatability. Therefore, it is preferred to grow more than kinds of semiconductor layers, so as to achieve a high stability and a high repeatability of a desired difference in effective refractive indices.

Figure 3:
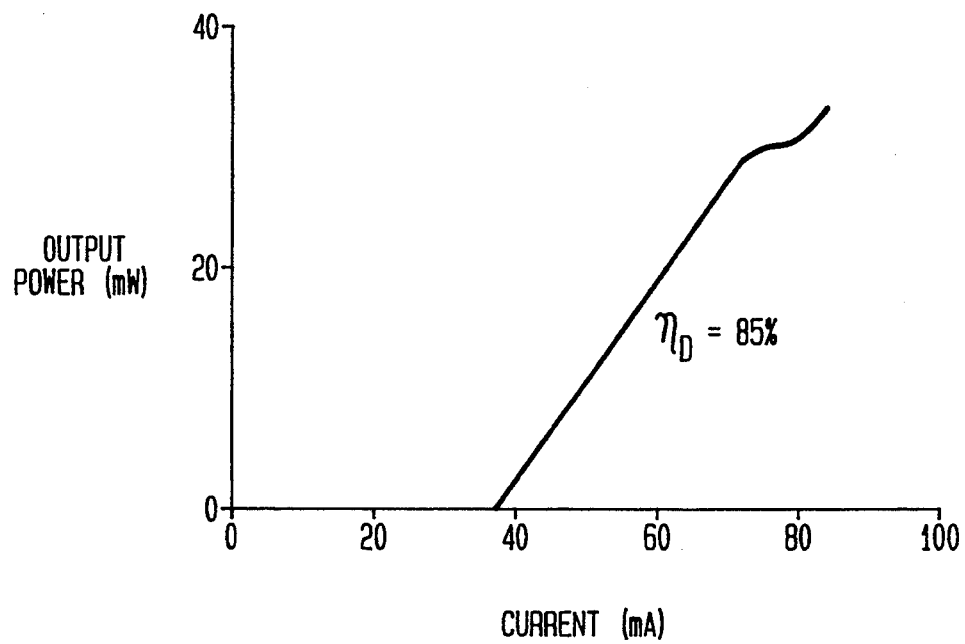
FIG. 3 is a graph showing the relationship between output of light and a current of a semiconductor laser according to the first example of the present invention.

FIG. 3 shows the relationship between output of light of the semiconductor laser of the present invention end a current injected therein. According to this semiconductor laser, output of light up to about 30 mW can be obtained without kinks, and the external differential quantum efficiency $\eta_D$ is as high as 85%. This is because the n-$(Al_{0.2}Ga_{0.8})_{0.51}In_{0.49}P$ first current blocking layer 7 and the n-$(Al_{0.7}Ga_{0.3})_{0.51}In_{0.49}P$ second current blocking layer 8 are used so as to achieve a difference in effective refractive indices in the horizontal direction. The energy band gaps of the first and second current blocking layers 7 and 8 are each larger than that of the $Ga_{0.51}In_{0.49}P$ active layer 4. Therefore, the light generated from the $Ga_{0.51}In_{0.49}P$ active layer 4 is not absorbed, so that the semiconductor laser has only a small propagation loss $a_i$. As a result, a high external differential quantum efficiency can be realized.

Figure 4:
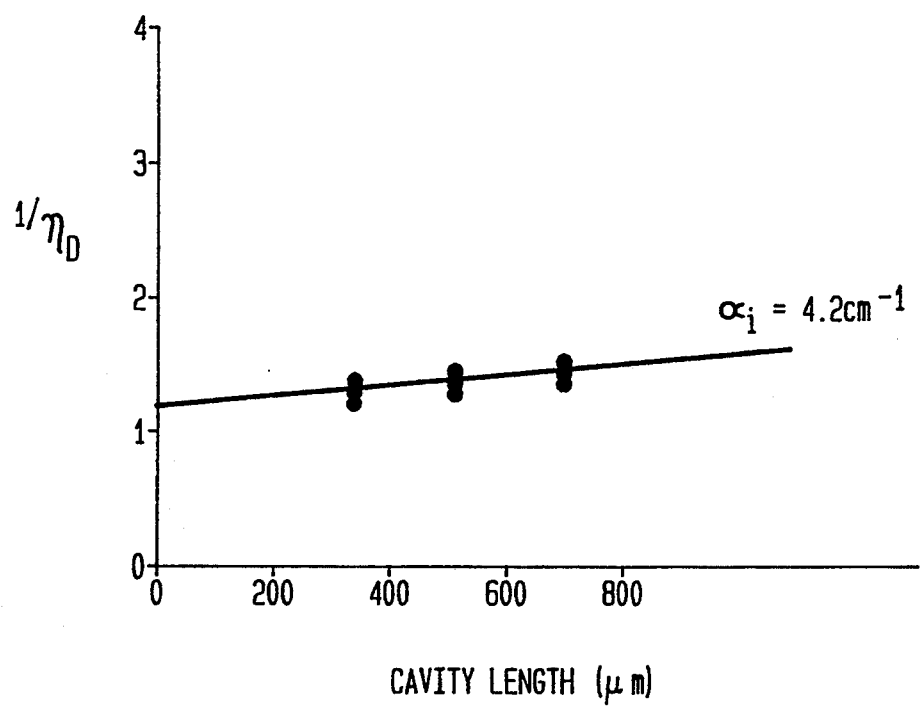
FIG. 4 is a graph illustrating the relationship between an inverse $1/\eta_D$ of an external differential quantum efficiency $\eta_D$ and a cavity length.

FIG. 4, which is a graph showing the relationship between an inverse $1/\eta_D$ of the external differential quantum efficiency and the cavity length of the semiconductor laser of the present invention illustrates experimental results for determining the propagation loss $a_1$. The inverse $1/\eta_D$ is in proportion to the cavity length, and the inclination therebetween determines the propagation loss $a_i$ to be 4.2 $cm^{-1}$. This value constitutes one fourth to one third of that of a conventional semiconductor laser, which is about 15 $cm^{-1}$. Stated otherwise, the external differential quantum efficiency of the semiconductor laser according to the present invention proves relatively high.

Figure 12:
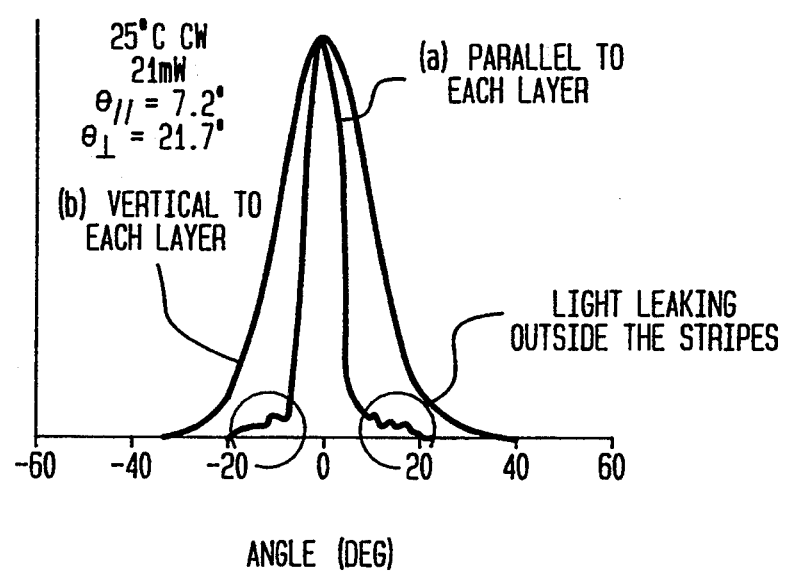
FIG. 12 is a graph showing far-field patterns of a semiconductor laser according to the first example of the present invention.

FIG. 12 shows measurement results of far-field patterns of the semiconductor laser according to the present invention to illustrate the high performance thereof. Herein, curve (a) represents the intensity distribution of output light with respect to angles parallel to each layer of the semiconductor laser, while curve (b) represents the intensity distribution of output light with respect to angles perpendicular to each layer of the semiconductor laser.

In curve (a), small side-lobes are observed on both sides of a main peak in the center, which are characteristic of a semiconductor laser according to the present invention. However, these side-lobes are not due to oscillation in higher-modes, but due to light which leaks outside the stripe-shaped ridge. As is seen from these far-field patterns, the semiconductor laser according to the present invention oscillates light in the fundamental mode, both horizontally and vertically (that is, if oscillates light in both the fundamental lateral mode and the fundamental transverse mode).

Figure 13:
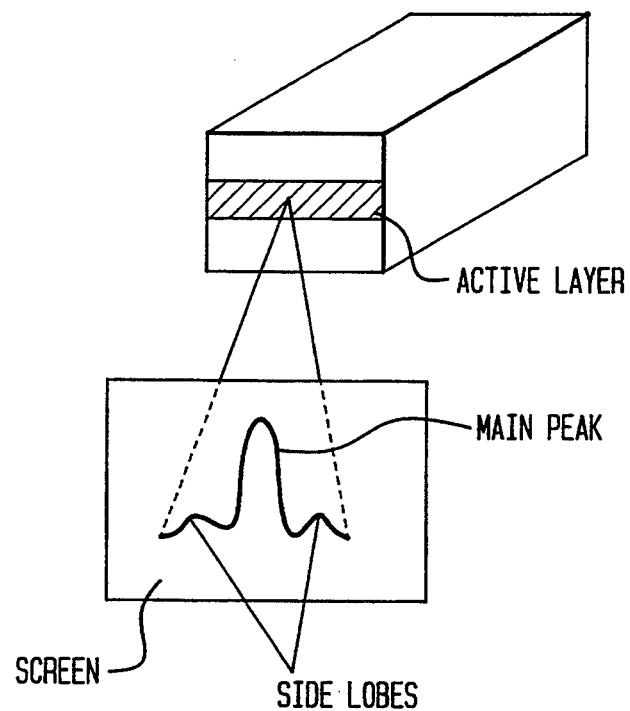
FIG. 13 is 8 view showing far-field patterns in a direction parallel to each layer of a semiconductor laser according to the first example of the present invention.

FIG. 13 further illustrates the main peak and side-lobes of intensity distributions with respect to angles parallel to each layer that are shown in FIG. 12.

As has been described, according to the present invention, a semiconductor laser with high output of light can be realized due to a high fundamental-lateral-mode stability and a high external differential quantum efficiency thereof.

Hereinafter, a method for producing the semiconductor laser according to the present invention will be described, with reference to FIGS. 5 to 9.

Figure 5:
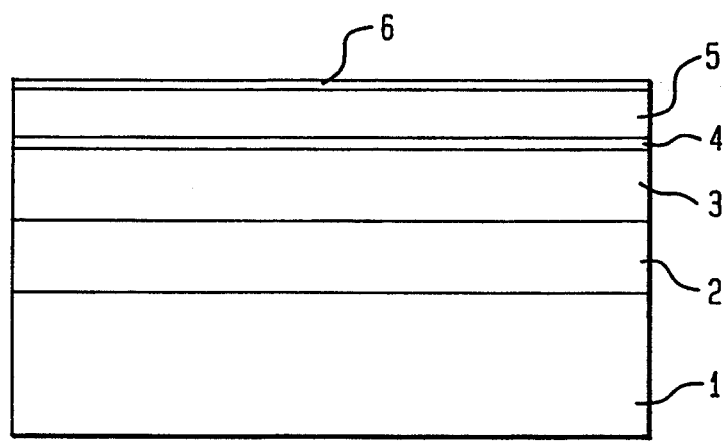
FIG. 5 is a cross-sectional view showing a first step for producing a semiconductor laser according to the first example of the present invention.
Figure 6:
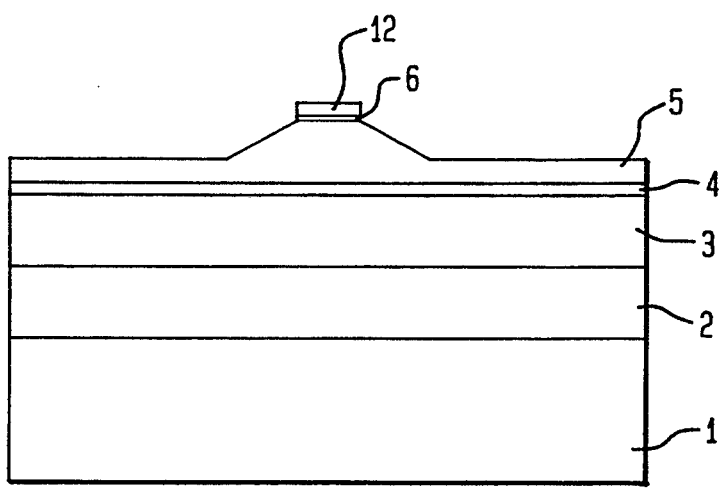
FIG. 6 is a cross-sectional view showing a second step for producing a semiconductor laser according to the first example of the present invention.
Figure 7:
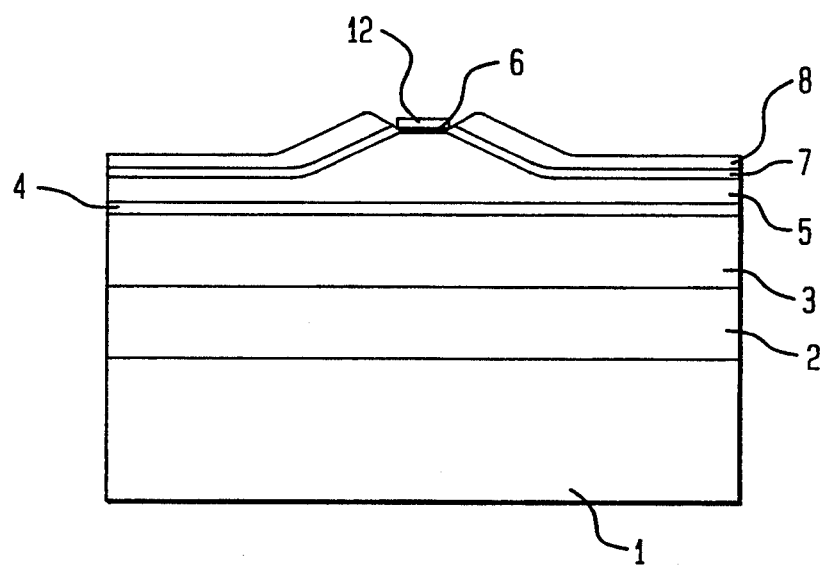
FIG. 7 is a cross-sectional view showing a third step for producing a semiconductor laser according to the first example of the present invention.
Figure 8:
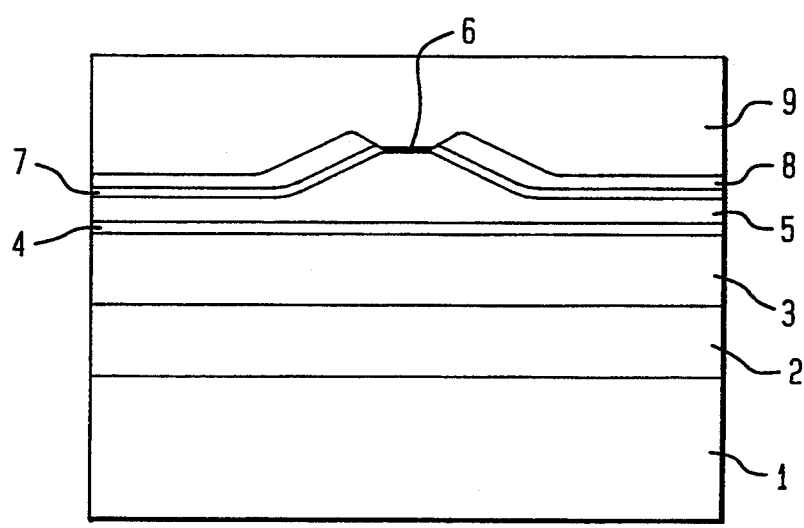
FIG. 8 is a cross-sectional view showing a fourth step for producing a semiconductor laser according to the first example of the present invention.
Figure 9:
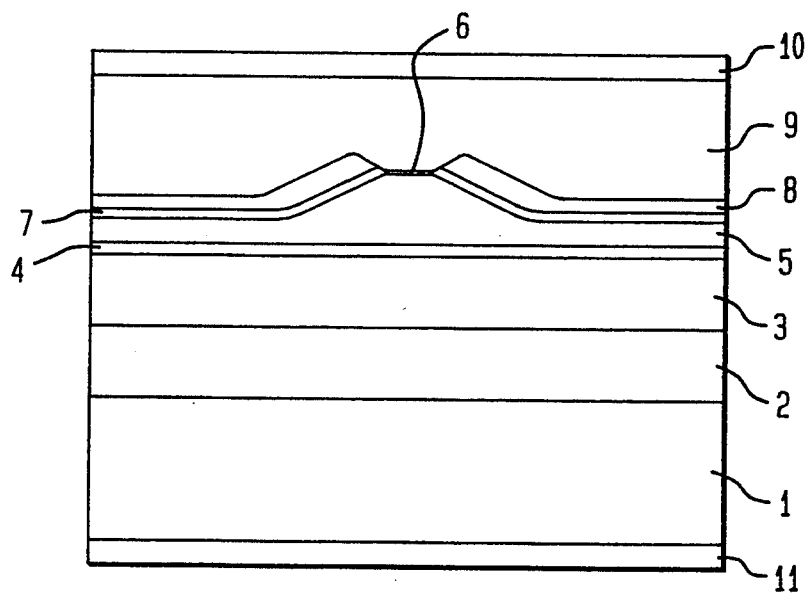
FIG. 9 is a cross-sectional view showing a fifth step for producing a semiconductor laser according to the first example of the present invention.
Figure 10:
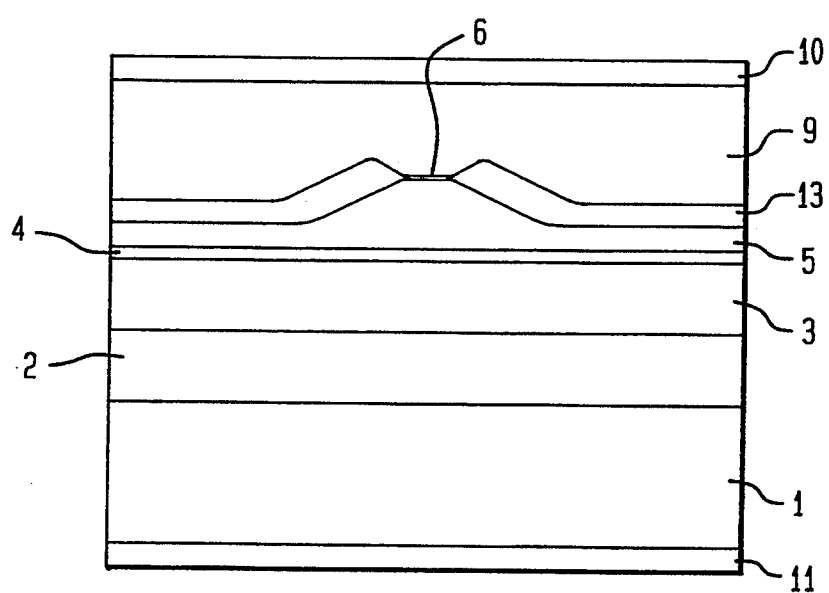
FIG. 10 is a cross-sectional view of a conventional example of a semiconductor laser for generating light of a red band.

First, as is shown in FIG. 5, by the use of a crystal growing method such as an MOVPE method, the n-GaAs buffer layer 2, the n-$(Al_{0.7}Ga_{0.3})_{0.51}In_{0.49}P$ cladding layer 3, the $Ga_{0.51}In_{0.49}P$ active layer 4, the p-$(Al_{0.7}Ga_{0.3})_{0.51}In_{0.49}P$ cladding layer 5, and the p-$Ga_{0.51}In_{0.49}P$ layer 5 are epitaxially grown upon the n-GaAs substrate 1 in the respective order. Next, as is shown in FIG. 6, an $SiO_2$ layer 12 is deposited upon the p-$Ga_{0.51}In_{0.49}P$ layer 6. Thereafter, by photolithography and etching, the $SiO_2$ layer 12, a portion of the p-$(Al_{0.7}Ga_{0.3})_{0.51}In_{0.49}P$ cladding layer 5, and the p-$Ga_{0.51}In_{0.49}P$ layer 6 are etched so as to form a stripe-shaped ridge having a trapezoidal cross section. Then, as is shown in FIG. 7, by a selective growing method such as an MOVPE method, the n-$(Al_{0.2}Ga_{0.8})_{0.51}In_{0.49}P$ first current blocking layer 7 and the n-$(Al_{0.7}Ga_{0.3})_{0.51}In_{0.49}P$ second current blocking layer 8 are epitaxially grown on side slopes of the stripe-shaped ridge having a trapezoidal cross section, without being grown on the $SiO_2$ layer 12. Then, as is shown in FIG. 8, the $SiO_2$ layer 12 is removed, and the p-GaAs capping layer 9 is epitaxially grown instead. Finally, as is shown in FIG. 9, Cr/Pt/Au is deposited upon the p-GaAs capping layer 9 so as to form the p-side electrode 10, and Au/Ge/Ni is deposited upon the bottom side of the n-GaAs substrate 1 so as to form the n-side electrode 11.

By the method described above, a lateral-mode-control type semiconductor laser shown in FIG. 1, which oscillates light of wavelengths pertaining to red regions, can be produced.

Instead of the two kinds of semiconductor layers, namely the n-$(Al_{0.2}Ga_{0.8})_{0.51}In_{0.49}P$ first current blocking layer 7 and the n-$(Al_{0.7}Ga_{0.3})_{0.51}In_{0.49}P$ second current blocking layer 8, three or more kinds of semiconductor lasers can be employed so as to achieve a desired difference in effective refractive indices.

Although the effective refractive index inside the stripe-shaped ridge is made smaller by 0.022 than that outside the stripe-shaped ridge in the above example, the difference in effective refractive indices can be adjusted within a range of 0.01 to 0.05 without undermining the effect of the present invention. However, the width of the stripe must also be changed according to the predetermined difference in effective refractive indices.

The effective refractive index outside the stripe-shaped ridge can be controlled by varying the thickness h of the stripe-shaped ridge and the thickness of the n-$(Al_{0.2}Ga_{0.8})_{0.51}In_{0.49}P$ first current blocking layer 7. Herein, h should preferably be within a range of 0.05 to 0.5 $\mu$m, and the respective thicknesses of the first and second current blocking layers 7 and 8 should preferably be within a range of 0.02 to 0.5 $\mu$m and a range of 0.3 to 1 $\mu$m.

Although certain materials were prescribed in the above example, $(Al_yGa_{1-y})_{0.51}In_{0.49}P$ may alternatively be used for the cladding layers 3 and 5, and $(Al_zGa_{1-z})_{0.51}In_{0.49}P$ ($0 \leq z \leq y \leq 1$) may alternatively used for the active layer 4. A semiconductor laser with a high fundamental-lateral-mode stability, a high external differential quantum efficiency, and high output of light can similarly be produced with facility by using such materials.

Moreover, although the semiconductor laser in the above example employs AlGaInP, use of other materials will not affect the effect of the present invention. A great effect can still be obtained in the case of a semiconductor laser made of a material of the II–VI group, as well as in the case of a semiconductor laser made of a material of the III–V group.

Moreover, although the active layer 4 in the above example is constituted by a single layer of AlGaInP semiconductor, an active layer having a multiple quantum well structure can also be used. For example, an active layer including a $Ga_{0.44}In_{0.56}P$ well layer (thickness: 8 nm), an $(Al_{0.45}Ga_{0.55})_{0.51}In_{0.49}P$ barrier layer (thickness: 5 nm), a $Ga_{0.44}In_{0.56}P$ well layer (thickness: 8 nm), an $(Al_{0.45}Ga_{0.55})_{0.51}In_{0.49}P$ barrier layer (thickness: 5 nm), and a $Ga_{0.44}In_{0.56}P$ well layer (thickness: 8 nm) may be employed. Such an active layer is referred to as a strained multiple quantum well active layer, because there is a compression strain of 0.5% in the three well layers. This multiple quantum well active layer is to be interposed between a pair of $(Al_{0.45}Ga_{0.55})_{0.51}In_{0.49}P$ light confinement layers (thickness: 10 nm), which are in contact with cladding layers.

EXAMPLE 2

Hereinafter, a semiconductor laser according to another example of the present invention will be described with reference to FIG. 16.

Figure 16:
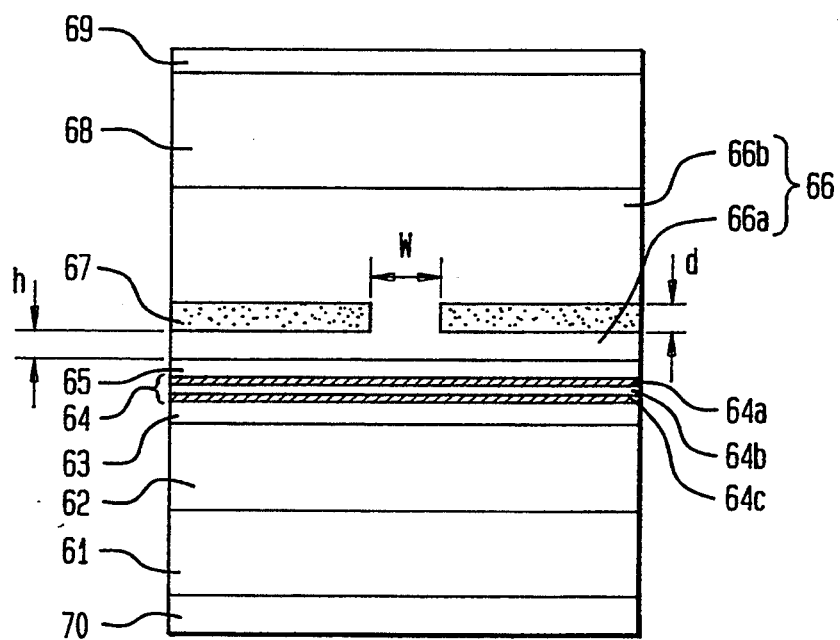
FIG. 16 is a cross-sectional view showing a semiconductor laser according to a second example of the present invention.

The semiconductor laser shown in FIG. 16 has an n-GaAs substrate 61 and a multi-layer structure formed on the n-GaAs substrate 61. The multi-layer structure includes an n-$Ga_{0.51}In_{0.49}P$ first cladding layer 62 (thickness: 1.5 $\mu$m), a GaAs first light confinement layer 63 (thickness: 0.01 $\mu$m), a strained quantum well active layer 64, a GaAs second light confinement layer 65 (thickness: 0.01 $\mu$m), a p-$Ga_{0.51}In_{0.49}P$ second cladding layer 66, an n-GaAs current confinement layer 67 (thickness: 0.15 $\mu$m), and a p-GaAs contact layer 68 (thickness: 3 $\mu$m), which are epitaxially grown upon the n-GaAs substrate 61 in the respective order. Upon the p-GaAs contact layer 68, a p-side electrode 69 is deposited, and upon the bottom side of the n-GaAs substrate 61, an n-side electrode 70 is deposited.

The strained quantum well active layer 64 has a quantum well structure constituted by an $In_{0.2}Ga_{0.8}As$ first well layer 64a (thickness: 7 nm), a GaAs barrier layer 64b (thickness: 10 nm), and an $In_{0.2}Ga_{0.8}As$ second well layer 64c (thickness: 7 nm).

The p-$Ga_{0.51}In_{0.49}P$ second cladding later 66 includes a first layer 66a (thickness: 0.2 $\mu$m) in contact with the light confinement layer 65, and a second layer 66b (thickness: 1.5 $\mu$m) in contact with the p-GaAs contact layer 68. Between the first layer 66a and the second layer 66b of the p-$Ga_{0.51}In_{0.49}P$ second cladding layer 66, the n-GaAs current confinement layer 67 is disposed.

The n-GaAs current confinement layer 67 is formed in regions excluding a region corresponding to a stripe-shaped predetermined region (current injecting region) of the strained quantum well active layer 64. In other words, the n-GaAs current confinement layer 67 has an stripe-shaped opening in the region corresponding to the current injecting region of the strained quantum well active layer 64, a width W of the opening determining the width of the current injecting region. The width W is typically 6 μm, but can be set at a value within a range of about 3 μm to about 8 μm. Moreover, the n-GaAs current confinement layer 67 has a higher refractive index than that of the p-$Ga_{0.51}In_{0.49}P$ second cladding layer 66, and also has a larger energy band gap than that of the strained quantum well active layer 64.

A difference in effective refractive indices inside and outside the stripe-shaped current injecting region can be controlled by varying the thickness h of the first layer 66a of the p-$Ga_{0.51}In_{0.49}P$ second cladding layer 66 and the thickness d of the n-GaAs current confinement layer 67. The thickness h of the first layer 66a of the p-$Ga_{0.51}In_{0.49}P$ second cladding layer 66 can be set at a value within a range of about 0.05 μm to 0.5 μm, while the thickness d of the n-GaAs current confinement layer 67 can be set at a value within a range of about 0.02 μm to 0.5 μm.

The semiconductor laser of the present example has the same effect as that of the semiconductor laser of the first example.

As for the cladding layers 62 and 66, $Al_xGa_{1-x}As$ (0.2≦x0.7) or $(Al_xGa_{1-x})_{0.51}In_{0.49}P$ (0≦x1) may alternatively be used. In a case where $(Al_xGa_{1-x})_{0.51}In_{0.49}P$ (0≦x≦1) is used for the cladding layers 62 and 66, the height of a height of a heterojunction between the active layer 64 and each cladding layer 62 or 66 can be set higher than in the case of the present example. Therefore, a semiconductor laser capable of operating stably at an even higher temperature can be provided by employing such cladding layers 62 and 66.

As has been described, according to the present invention, a high-power semiconductor laser with a small propagation loss, a high external differential quantum efficiency, end a high fundamental-lateral-mode stability can be provided. The reason is that the semiconductor laser includes a semiconductor layer formed in regions excluding a stripe-shaped ridge, the semiconductor layer having a refractive index higher than that of a cladding layer disposed outside the stripes, thereby reducing loss of light due to absorption.

Moreover, according to a method for producing a semiconductor laser of the present invention, a semiconductor laser having the properties described above can be produced with ease and a high repeatability. The reason is that the method includes a step of laminating␣8 first cladding layer, an active layer, and a second cladding layer in the respective order, a step of forming a portion of the second cladding layer into a stripe-shaped ridge having a trapezoidal cross section, and a step of laminating at least two or more kinds of semiconductor layers upon a portion of the second cladding layer excluding the stripe-shaped ridge so as to obstruct current injection, and because the two or more kinds of semiconductor layers have different refractive indices.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. In semiconductor laser, a semiconductor structure comprising:
    a semiconductor substrate; and
    a multi-layer structure formed upon the semiconductor substrate, the multi-layer structure including an active layer, a pair of cladding layers between which the active layer is interposed, and a current confinement layer for injecting a current into a stripe-shaped predetermined region of the active layer,
    wherein the current confinement layer comprises a first current blocking layer formed in regions thereof excluding a region corresponding to the predetermined region of the active layer, the first current blocking layer having a refractive index higher than a refractive index of the pair of cladding layers and an energy band gap larger than an energy band gap of the active layer.

2. A semiconductor laser according to claim 1, wherein one of the pair of cladding layers that is disposed above the active layer has a stripe-shaped ridge stretching along a direction of a cavity of the semiconductor laser; and the first current blocking layer, formed upon the one of the pair of cladding layers having the stripe-shaped ridge covers a region of the one of the pair of cladding layers excluding the stripe-shaped ridge thereof.

3. A semiconductor laser according to claim 2, wherein the current confinement layer further comprises a second current blocking layer formed upon the first current blocking layer; and the second current blocking layer is a semiconductor layer having a different refractive index from the refractive index of the first current blocking layer and having a larger energy band gap than the energy band gap of the active layer.

4. A semiconductor laser according to claim 3, wherein a cross section of the stripe-shaped ridge constituting a plane perpendicular to the direction as the cavity is trapezoidal.

5. A semiconductor loser according to claim 3, wherein a cross section of the stripe-shaped ridge constituting a plane perpendicular to the direction of the cavity is rectangular.

6. A semiconductor laser according to claim 3, wherein the semiconductor substrate is made of GaAs; the active layer is made of GaInP; and the first and second current blocking layers and the pair of cladding layers are made of respectively different compositions of AlGaInP.

7. A semiconductor laser according to claim 1, wherein the active layer has a multiple quantum layer structure.

8. A semiconductor laser according to claim 1, wherein one of the pair of cladding layers has a first layer and a second layer, between which the first current blocking layer is interposed.

9. A semiconductor laser according to claim 8, wherein the semiconductor substrate is made of GaAs; the pair of cladding layers are made of GaInP; and the first current blocking layer is made of GaAs.

10. A semiconductor laser according to claim 8, wherein the active layer has a multiple quantum well structure.

11. A semiconductor laser according to claim 3, wherein the refractive index of the second current blocking layer is lower than that of the first current blocking layer.

12. A semiconductor laser according to claim 3, wherein the refractive index of the second current blocking layer is substantially the same as that of the cladding layers.

13. In a method for producing a semiconductor laser including the step of forming a multi-layer structure upon a semiconductor substrate, the improvement comprising the steps of:

forming a first cladding layer;

forming an active layer upon the first cladding layer;

forming a film to become a second cladding layer upon the active layer;

selectively etching a portion of the film so as to form a stripe-shaped ridge stretching along the direction of a cavity, thereby forming the second cladding layer;

forming a first semiconductor layer upon a portion of the second cladding layer excluding the stripe-shaped ridge, the first semiconductor layer having a refractive index higher than a refractive index of the second cladding layer and an energy band gap larger than the energy band gap of the active layer; and forming a second semiconductor layer on the first semiconductor layer, the second semiconductor layer having a different refractive index from the refractive index of the first semiconductor layer and having an energy band gap larger that the energy band gap of the active layer.

* * * * *

UNITED STATES PATENT AND TRADEMARK OFFICE
CERTIFICATE OF CORRECTION

PATENT NO.    : 5,383,214
DATED         : January 17, 1995
INVENTOR(S)   : Kidoguchi et al.

Page 1 of 2

It is certified that error appears in the above-identified patent and that said Letters Patent is hereby corrected as shown below:

On the cover page, left column, last line, delete "$\lambda_I$" and insert --$\lambda_L$--.

On the title page, item [56] insert under U.S. Patent Documents:

--4,169,997    10/79    Logan et al. .............. 372/45

4,194,933      03/80    Logan et al. .............. 148/171

Insert under Foreign Patent Documents:
EPA0337688    10/89    EPO

EPA0440471    08/91    EPO

DEA2819843    11/78    Germany

Insert under Other Publications:
European Search Report for Corresponding Application No. 93111443.3, dated 12/22/93.

Y. K. Chen, et al., "Self-aligned InGaAs/GaAs/ InGaP quantum well lasers prepared by gas-source molecular beam epitaxy with two growth steps", *Applied Physics Letters, Vol. 59, No. 23*, pp. 2929-2931 (12/91).

UNITED STATES PATENT AND TRADEMARK OFFICE
CERTIFICATE OF CORRECTION

PATENT NO.    : 5,383,214
DATED         : January 17, 1995
INVENTOR(S)   : Kidoguchi et al.

It is certified that error appears in the above-identified patent and that said Letters Patent is hereby corrected as shown below:

Song Jae Lee, et al., "Buried-ridge striped planar GaAiAs/GaAs lasers with a wide range of effective index steps", Applied Physics Letters, Vol. 56, No. 7, pp. 599-601 (02/12/90).

Song Jae Lee et al., "Leaky Guided Channeled Substrate Planar (LCSP) Laser with Reduced Substrate Radiation and Heating", IEEE Journal of Quantum Electronics, Vol. 25., No. 7, pp. 1632-1645 (07/1989).--

Column 12, line 4, before "semiconductor" first occurance insert --a--.

Column 12, line 41, delete "as" and insert --of--.

Column 14, line 14, delete "that" and insert --than--.

Signed and Sealed this

Twenty-second Day of August, 1995

Attest:

BRUCE LEHMAN

*Attesting Officer*     *Commissioner of Patents and Trademarks*